United States Patent [19]

Gedney et al.

[11] 4,082,394
[45] Apr. 4, 1978

[54] METALLIZED CERAMIC AND PRINTED CIRCUIT MODULE

[75] Inventors: Ronald Walker Gedney, Endicott; Robert Richard Rodite, Endwell, both of N.Y.

[73] Assignee: International Business Machines Corporation, Armonk, N.Y.

[21] Appl. No.: 756,227

[22] Filed: Jan. 3, 1977

[51] Int. Cl.² .............................................. H05K 1/12
[52] U.S. Cl. .............................. 339/17 M; 174/52 FP
[58] Field of Search ............. 339/17 R, 17 C, 17 CF, 339/17 LM, 17 M, 17 N, 17 E, 18 R, 18 B, 18 C, 18 P, 96, 193 P; 361/414, 392, 399, 404; 174/52 FP

[56] References Cited

U.S. PATENT DOCUMENTS

| | | | |
|---|---|---|---|
| 2,766,435 | 10/1956 | French | 339/17 M |
| 3,333,225 | 7/1967 | McNutt | 339/17 M |

OTHER PUBLICATIONS

IBM Tech. Disc. Bulletin, Truchi, Two-Level Printed Circuit Card, vol. 14, No. 11, Apr. 1972, p. 3482.
IBM Tech. Disc. Bulletin, Olson, Low-Noise Interconnection System for Monolithic Modules, vol. 9, No. 4, Sept. 1966, p. 360.

*Primary Examiner*—Neil Abrams
*Attorney, Agent, or Firm*—G. R. Gugger

[57] ABSTRACT

A package assembly which combines metallized ceramic technology and printed circuit board multilayer technology. A plurality of modules on a metallized ceramic substrate have closely spaced pins, for example, on 50 mil centers or grid, are plugged into a complex high precision multilayer printed circuit carrier. The pins are staggered in height with the longer pins having a relatively wide spacing, for example, on 100 mil centers or grid. The longer pins protrude through the high precision carrier and plug into a normal relatively simple and low cost printed circuit card or planar package.

1 Claim, 4 Drawing Figures

METALLIZED CERAMIC AND PRINTED CIRCUIT MODULE

BACKGROUND OF THE INVENTION

In the present art for multichip modules which involve either a metallized ceramic (MC) module or a metallized multilayer ceramic (MLC) module, it was found that both suffer from limitations for extension to future cost/performance application. The MC module at present is a single layer of metallurgy on the surface of a ceramic substrate with a limited extension to being made double sided because of the scarcity of wiring vias available. Also, I/O pins are limited especially in a multichip application since each chip site on the module removes one to five staked pin via positions. Further decrease in pin pitch to compensate for this has to date not been practical because of the industry standardization on a 100 mil pin grid which is violated only in a few special situations. This also contributes to a relatively low logic chip density possibility which is counter to both cost and performance. For high performance, the MC module was limited to single chip applications.

The MLC module also has its own set of limitations. While higher chip density and wireability are possible, the cost is higher and the performance is limited. First, the cost is higher due to the large amount of work content in its production. The signal lines are screened resulting in very low line density and, therefore, large numbers of required signal layers. Further, for high performance application, the screening process is pushed to its limits, presently only 4 mil width lines, resulting in excessive touch up steps and more expense. The MLC module is considered by the industry to be a relatively expensive package.

With regard to performance, the electronic signals propogate now internally through the ceramic which has a dielectric constant of approximately 9. This results in a propogation delay equal to 3 times that of air, the square of the dielectric constant. Further delays result from pulse degration caused by skin effect which is a function of the line resistance. The MLC is forced to use the higher resistance refractory metals that can withstand high ceramic fusion temperatures. Typically, moly conductor of a 4 mil width will have ten times the resistance per unit length than that of a 1 mil copper MC line. This skin effect can add up to 50% more delay to a signal for path lengths in the range of a multichip module, and also restricts circuit designers who must allow for higher signal resistances in their net design. Finally, a very important requirement in high performance is engineering change capability. Internal ceramic deletes of signal lines is, at best, very difficult.

SUMMARY OF THE INVENTION

The present invention overcomes all of the above described limitations by combining metallized ceramic technology with printed circuit multilayer technology.

A standard metallized ceramic substrate with integrated circuit chips mounted thereon; i.e., an MC module, is provided which has smaller diameter I/O pins than are normally used. The pins are on a 50 mil grid on the module and may be either in a straight or staggered alignment. These pins are also provided with a staggered pin length dimension with the shorter pins being on a 50 mil grid and of suitable length to plug into plated thru holes in a high precision multilayer organic printed circuit carrier or first level package. The longer pins which are on a 100 mil grid have a sufficient length to protrude through plated thru holes in the multilayer printed circuit carrier and plug into plated thru holes in a conventional relatively simple printed circuit card or second level package.

This novel MC and printed circuit carrier module makes possible multichip wiring to provide the organic multilayer printed circuit carrier below the ceramic with ample wireability for multichip applications.

I/O's are greatly increased due to the small pins and a non-standard grid. This grid is further translated by the organic mutlilayer printed circuit carrier to the standard economical grid.

High chip density is achieved by the high I/O density now available on the MC module.

The total cost of the present package is lower than a multilayer ceramic module since photolythography is used for the signal lines of both the MC and multilayer carrier circuits, both of which are at dimensions far from limiting. Work content would be low and the yield high.

The dielectric constant of the MC surface is equal to 1, since the signal line is open to the air, and the dielectric constant of the organic printed circuit is 4. This results in a much faster signal propagation velocity.

The signal lines for both the MC and the organic printed circuit carrier are copper which virtually eliminates all resistance concerns.

Engineering changes can now be achieved in a similar manner as printed circuit cards by relatively simple deleting in the soft organic media.

Accordingly, a primary object of the present invention is to provide a novel and improved customized module which combines metallized ceramic technology and printed circuit board multilayer technology.

Another object of the present invention is to provide a novel and improved customized module which comprises the interconnecting of a metallized ceramic module with a complex multilayer printed circuit carrier and a relatively simple printed circuit card.

A still further object of the present invention is to provide a metallized ceramic module having closely spaced pins which are staggered in height with the shorter pins plugged into plated thru holes in a complex multilayer printed circuit carrier and longer pins which protrude through plated thru holes in said carrier and plug into plated thru holes in a relatively simple printed circuit card.

A further object of the present invention is to provide a low cost metallized ceramic module and printed circuit carrier and printed circuit card combination wherein multichip wiring is improved, high chip density is achieved, and better signal propagation is accomplished.

The foregoing and other objects, features and advantages of the invention will be apparent from the following more particular description of preferred embodiments of the invention, as illustrated in the accompanying drawings.

DESCRIPTION OF PREFERRED EMBODIMENTS

Figure 1:
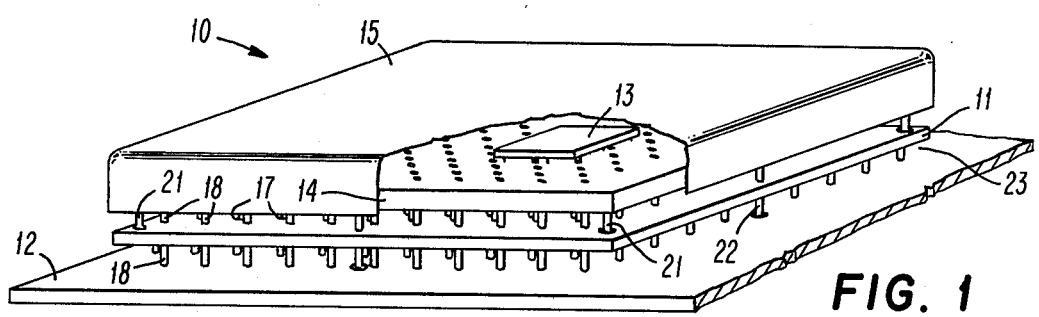
FIG. 1 is a diagrammatic view showing a metallized ceramic module, a printed circuit carrier, and a printed circuit card assembled as a package in accordance with the principles of the present invention.
Figure 2:
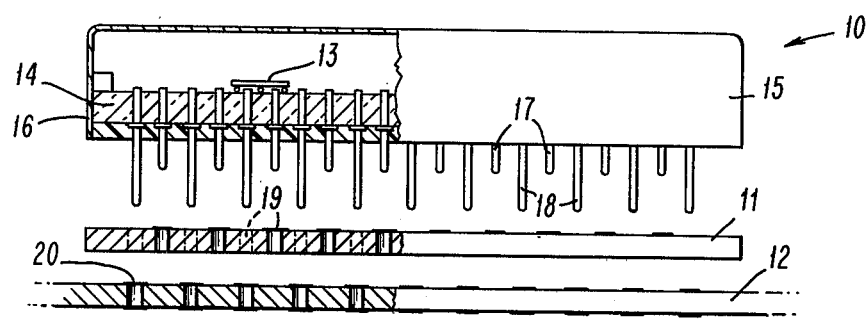
FIG. 2 is an elevation view, partially in section, showing the combination of FIG. 1 disassembled.

Referring to FIGS. 1 and 2, there is shown the package assembly of the present invention which comprises the metallized ceramic module 10, a multilayer printed circuit carrier 11, and a conventional printed circuit card 12. The ceramic module includes a plurality of integrated circuit chips 13. A standard 24 mm, 28 mm, 36 mm, or larger metallized ceramic substrate 14 is used and techniques known in the industry may be employed to provide circuitizing, joining of the chips 13, provision of a cap 15 and suitable top seal and also the provision of a suitable back seal 16.

A feature of the present invention is that the conventional metallized ceramic module is modified to have smaller diameter circuit connecting pins than normally used. The pins measure 12 mils in diameter or less and are divided up into short pins 17 and longer pins 18. The pins 17 and 18 are positioned on a 50 mil pin grid on the ceramic module and may either be staggered, as shown in FIG. 1, wherein there would be 70.7 mils distance to each pin and 221 pin positions for a 28 mm module, or the pins may be arranged in alternate fashion on straight horizontal and vertical lines wherein there is a 50 mil distance between each pin and there are 484 pin positions for a 28 mm module.

In addition to being on a 50 mil grid, the pins have a staggered pin length dimension with the shorter pins 17 being of suitable length to accommodate the thickness of the multilayer circuit carrier 11 and a suitable space directly underneath for cleaning and the longer pins 18, which will be on a 100 mil grid, will be of suitable length to protrude through the second level package or printed circuit card 12 and allow a space for cleaning after soldering of the pins between the carrier 11 and card 12.

The multilayer printed circuit carrier 11 has drilled plated thru holes 19 corresponding to the MC module grid and having a hole diameter which will accommodate the module pin diameter. The carrier 11 may be the same size as the MC module and it may have 2, 4, 6 or more signal planes along with internal ground and voltage planes.

The shorter module pins 17 plug into their respective plated thru holes 19 in carrier 11 to connect with the carrier circuitry and the pins are suitably soldered to the holes on the underside of the carrier. The longer pins 18 protrude through their respective plated holes 19 in carrier 11 to connect with the carrier circuitry and also plug into drilled plated thru holes 20 in the printed circuit card 12 to connect with circuitry thereon. The pins 18 are soldered to the holes 20 on the underside of the card.

Four shouldered standoff pins 21 are soldered between the corners of the module and the carrier and four longer shouldered standoff pins 22 are soldered between the corners of the module and the card. This allows for accurate positioning of both the carrier and the card in relation to the top portion of the module. Clearance holes may be provided at the corners of the carrier or the corners may be cut to allow passage of the longer standoff pins 22. The longer standoff pins 22 and also pins 18 have a sufficient length so that a space 23 is left between the bottom of carrier 11 and the top of the card 12 to avoid the entrapment of contaminants and to leave room for solvent cleaning after soldering.

Figure 3:
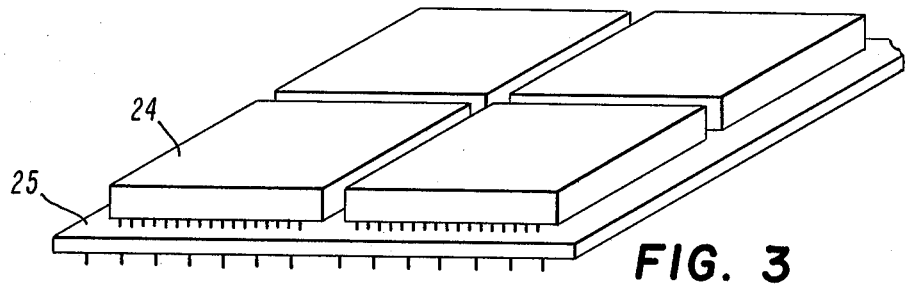
FIG. 3 is a diagrammatic view showing the package of FIG. 1 wherein a plurality of single chip metallized ceramic modules are employed.

FIG. 3 shows the utilization of a plurality of very small single chip modules 24 plugged into a multilayer printed circuit carrier 25 for achieving the same chip density as if one large multichip module was used.

Figure 4:
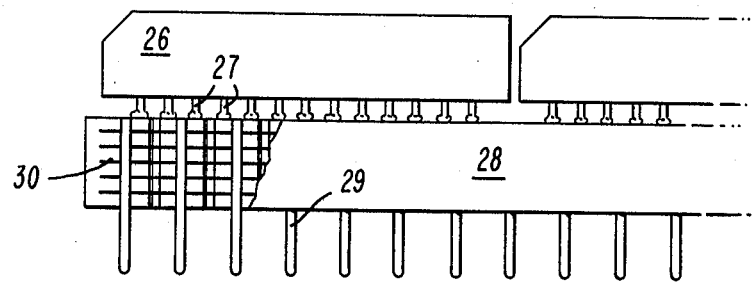
FIG. 4 is an elevational view, partially in section, showing another embodiment of the ceramic module and printed circuit carrier of FIGS. 1 and 2.

Another embodiment of the present invention is shown in FIG. 4 wherein instead of using staggered pins the MC module 26 is provided with only short pins 27 which are soldered to the surface of an multilayer organic printed circuit carrier 28 which would connect by way of pins 29 to a printed circuit card or second level package. This embodiment allows more room internal to the printed circuit carrier for signal, voltage and ground planes 30.

In addition to the previously mentioned advantages of the present invention, the staggered height pins can be used for bringing out critical test points in a microprocessor module. Further staggered pins can bring out the test points without congesting card wireability since only the functionally required I/O pins would be extended the full length.

Also, the present invention makes possible the use of the so-called "Module Master Slice" technology wherein a standard multichip module could be customized for its unique usage and stored along with organic multilayer printed circuit carriers and the conventional printed circuit cards. When a particular function is desired, a carrier may be selectively circuitized and the package put together greatly reducing present turn around time.

There has been described the use of 50 mil and 100 mil pin grids; however, it will be understood that the present invention is not limited to these specific pin grids and that other pin grid sizes could be used just as well.

While the invention has been particularly shown and described with reference to preferred embodiments thereof, it will be understood by those skilled in the art that various changes in form and details may be made therein without departing from the spirit and scope of the invention.

What is claimed is:

1. A metallized ceramic and printed circuit module which comprises:
 a plurality of integrated circuit chips;
 a metallized circuit ceramic substrate on which said chips are mounted with one layer of circuit lines on the surface of said substrate being connected to said chips, the number of interconnections between said circuit lines and chips being limited because no two of said circuit lines can cross;
 a plurality of I/O pins arranged on a closely spaced pin grid to provide a high I/O pin density and which pins are staggered in height to provide short pins and relatively longer pins;
 a multilayer organic printed circuit carrier having a plurality of signal, ground and voltage planes and having plated thru holes connected to said planes and arranged on a pin grid corresponding to the pin grid of said module and into which said pins are plugged with said longer pins protruding out the other side of the carrier and said shorter pins ending with said carrer, said high I/O pin density allowing multichip wiring to provide said multilayer carrier with ample wireability for multichip applications, said interconnections between said short pins compensating for the lack of crossover ability in the layer of circuit lines on said ceramic substrate; and a printed circuit card having plated thru holes arranged on a low I/O pin density grid corresponding to only that of said longer pins and into which said longer pins are plugged to connect with circuitry thereon.

* * * * *